US008344794B2

(12) United States Patent
Li

(10) Patent No.: US 8,344,794 B2
(45) Date of Patent: Jan. 1, 2013

(54) SIGNAL MONITORING SYSTEMS

(75) Inventor: Guoxing Li, Sunnyvale, CA (US)

(73) Assignee: O2Micro Inc., Santa Clara, CA (US)

( * ) Notice: Subject to any disclaimer, the term of this patent is extended or adjusted under 35 U.S.C. 154(b) by 83 days.

(21) Appl. No.: 12/962,210

(22) Filed: Dec. 7, 2010

(65) Prior Publication Data

US 2011/0309880 A1 Dec. 22, 2011

Related U.S. Application Data

(60) Provisional application No. 61/357,181, filed on Jun. 22, 2010.

(51) Int. Cl.
*H03B 1/00* (2006.01)
(52) U.S. Cl. ...................................................... 327/554
(58) Field of Classification Search .................. None
See application file for complete search history.

(56) References Cited

U.S. PATENT DOCUMENTS

| | | | | |
|---|---|---|---|---|
| 5,736,895 A | * | 4/1998 | Yu et al. | 327/554 |
| 2007/0260409 A1 | * | 11/2007 | Boerstler et al. | 702/79 |
| 2009/0227216 A1 | * | 9/2009 | Lozhkin | 455/114.3 |

* cited by examiner

*Primary Examiner* — Lincoln Donovan
*Assistant Examiner* — Sibin Chen

(57) ABSTRACT

A signal filter includes a node, a first terminal, a second terminal, and energy storage circuitry coupled to the node and the first and second terminals. The node receives an input signal and a reference signal selectively. The first terminal provides an output signal determined by the input signal and the reference signal. The second terminal receives a feedback signal indicative of the output signal. The energy storage circuitry generates the output signal at the first terminal according to the input signal and the reference signal. The energy storage circuitry also receives the input signal via the node and the feedback signal via the second terminal in alternating fashion. A dominant pole of the signal filter is controlled by the frequency at which the input signal and the feedback signal alternate.

20 Claims, 8 Drawing Sheets

SIGNAL MONITORING SYSTEMS

RELATED APPLICATION

This application claims priority to U.S. Provisional Application No. 61/357,181, filed on Jun. 22, 2010, which is hereby incorporated by reference in its entirety.

BACKGROUND

FIG. 1 illustrates a conventional signal monitoring system 100. The signal monitoring system 100 includes a differential resistor-capacitor (RC) low-pass filter (LPF) 102 and a differential analog-to-digital converter (ADC) 104. The differential ADC 104 includes input terminals INP and INN coupled to the differential RC LPF 102. The RC LPF 102 receives an input signal $V_{IN}$, blocks or attenuates high-frequency noises mixed in the input signal $V_{IN}$, and passes a low-frequency portion $V'_{IN}$ of the input signal $V_{IN}$ to the ADC 104. The RC LPF 102 can generate a pair of output signals $V_{OUT1}$ and $V_{OUT2}$, and control a difference between the output signals $V_{OUT1}$ and $V_{OUT2}$ to be equal to the $V'_{IN}$ multiplied by a gain $g_{102}$ of the RC LPF 102, e.g., $V_{OUT2} - V_{OUT1} = V_{IN} * g_{102}$. The ADC 104 can receive a differential signal $V_D$, e.g., $V_D = V_{OUT2} - V_{OUT1}$, and generate a digital signal 106 indicative of the differential signal $V_D$.

However, in the conventional signal monitoring system 100, there is a tradeoff between the system response speed and the monitoring accuracy. More specifically, according to the characteristics of a low-pass filter, a dominant pole $f_p$ (or a first pole) of the RC LPF 102 is given by: $f_p = 1/(2\pi * R * C)$, where R represents an equivalent resistance of the RC LPF 102, and C represents an equivalent capacitance of the RC LPF 102. Since the equivalent resistance and the equivalent capacitance of the RC LPF 102 are constant, the dominant pole $f_p$ of the RC LPF 102 is also constant. Thus, the bandwidth of the RC LPF 102 that is determined by the dominant pole $f_p$ is also constant.

On one hand, in order to increase the response speed for the RC LPF 102 to vary the output signals $V_{OUT1}$ and $V_{OUT2}$ according to a variation of the input signal $V_{IN}$, the bandwidth of the RC LPF 102 needs to increase. However, the larger the bandwidth of the RC LPF 102, the more the noise mixed in the input signal $V_{IN}$ can be passed to the ADC 104. In other words, increasing the bandwidth of the RC LPF 102 filter can decrease the monitoring accuracy of the signal monitoring system 100. On the other hand, in order to decrease the noise passed to the ADC 104, the bandwidth of the RC LPF 102 needs to decrease. However, the narrower the bandwidth of the RC LPF 102, the slower the response speed of the RC LPF 102. Thus, there is a tradeoff between response speed and monitoring accuracy. It is difficult for the conventional signal monitoring system 100 to enhance both response speed and monitoring accuracy.

In addition, if the input signal $V_{IN}$ ranges from 0V to 5V, and the gain $g_{102}$ of the RC LPF 102 is equal to one, then the differential signal $V_D$ from the RC LPF 102 to the ADC 104 also ranges from 0V to 5V. Since the ADC 104 is a bipolar input ADC, the differential input range of the ADC 104 is at least −5V to 5V. If the ADC 104 is a 12-bit ADC, the least significant bit (LSB) of the ADC 104 is given by: LSB=$5/2^{11}$=2.44 mV. The larger the LSB, the lower the measurement precision of the ADC 104. However, in the signal monitoring system 100, half of the differential input range of the ADC 104, e.g., the range from −5V to 0V, is wasted.

SUMMARY

In one embodiment, a signal filter includes a node, a first terminal, a second terminal, and energy storage circuitry coupled to the node and the first and second terminals. The node receives an input signal and a reference signal selectively. The first terminal provides an output signal determined by the input signal and the reference signal. The second terminal receives a feedback signal indicative of the output signal. The energy storage circuitry generates the output signal at the first terminal according to the input signal and the reference signal. The energy storage circuitry also receives the input signal via the node and the feedback signal via the second terminal in alternating fashion. A dominant pole of the signal filter is controlled by the frequency at which the input signal and the feedback signal alternate.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In one embodiment, the present invention provides a signal monitoring system that includes a differential filter and a differential conversion circuit, e.g., an analog-to-digital converter (ADC). The signal monitoring system controls a dominant pole of the filter so as to control a bandwidth of the filter. By controlling the bandwidth of the filter, the response speed of the signal monitoring system and the monitoring accuracy of the signal monitoring system are enhanced. In addition, the filter can control the level of a differential input signal of the ADC, such that the differential input range of the ADC is fully utilized. The differential input range of the ADC can also be reduced to enhance the measurement precision of the ADC.

Figure 2:
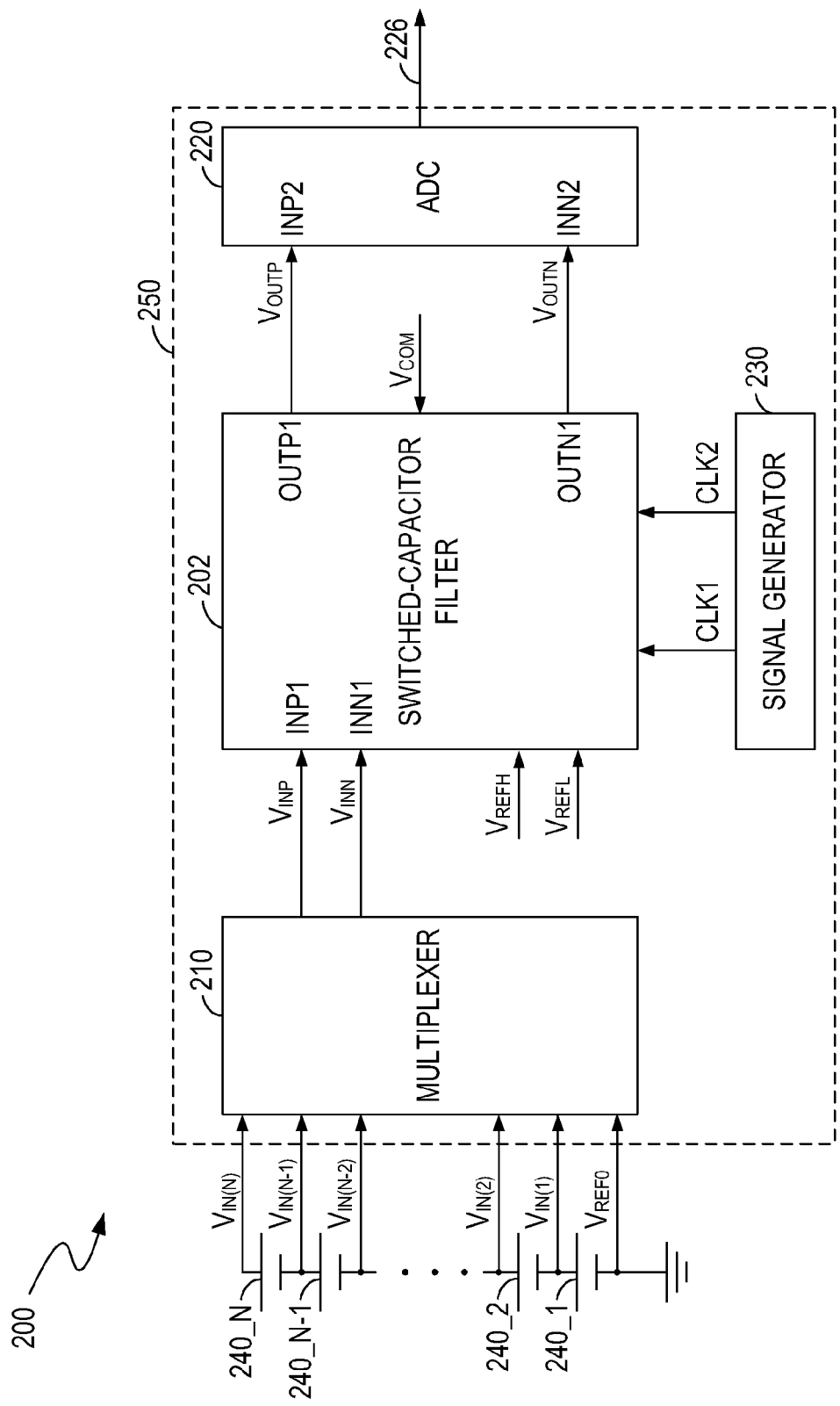
FIG. 2 illustrates a block diagram of an example of a battery monitoring system, in accordance with one embodiment of the present invention.

FIG. 2 illustrates a block diagram of an example of a battery monitoring system 200, in accordance with one embodiment of the present invention. The battery monitoring system 200 includes a set of cells 240_1, 240_2, ..., 240_N, e.g., Lithium-Ion battery cells or lead-acid battery cells. The battery monitoring system 200 further includes a signal monitoring system 250 operable for monitoring cell voltages of the cells 240_1-240_N. The signal monitoring system 250 includes a multiplexer 210, a signal filter 202, e.g., a switched-capacitor (SC) filter, an ADC 220, e.g., a differential ADC, and a signal generator 230. In one embodiment, the signal filter 202 is a differential switched-capacitor low-pass filter.

As shown in FIG. 2, the multiplexer 210 receives a set of signals $V_{IN(1)}$, $V_{IN(2)}$, ..., $V_{IN(N)}$, and a signal reference $V_{REF0}$, and provides input signals $V_{INN}$ and $V_{INP}$ to the signal filter 202. In one embodiment, the signal reference $V_{REF0}$ is used as the common ground for the signals $V_{IN(1)}$, $V_{IN(2)}$, ..., $V_{IN(N)}$. The signal reference $V_{REF0}$ can be grounded or provided by a voltage reference source (not shown in FIG. 2). In the example of FIG. 2, the input signals $V_{IN(1)}$, $V_{IN(2)}$, ..., $V_{IN(N)}$ are terminal voltages at the positive terminals of the cells 240_1-240_N, respectively, and the signal reference $V_{REF0}$ is grounded.

In one embodiment, the input signal $V_{INN}$ can be grounded. Thus, the signal filter 202 receives a single-ended signal, e.g., the input signal $V_{INP}$, and generates a differential output signal to the ADC 220. The input signal $V_{INP}$ can be selected from cell voltages $V_1$, $V_2$, ..., $V_N$ of the cells 240_1, 240_2, ..., 240_N. By way of example, the multiplexer 210 receives the terminal voltages $V_{IN(1)}$, $V_{IN(2)}$, ..., $V_{IN(N)}$ and the signal reference $V_{REF0}$, and generates the cell voltages $V_1$, $V_2$, ..., $V_N$ that are respectively equal to the differences $V_{IN(1)}-V_{REF0}$, $V_{IN(2)}-V_{IN(1)}$, ..., $V_{IN(N)}-V_{IN(N-1)}$. The multiplexer 210 further selects the input signal $V_{INP}$ from the cell voltages $V_1$, $V_2$, ..., $V_N$ and delivers the input signal $V_{INP}$ to the signal filter 202.

In another embodiment, the input signals $V_{INN}$ and $V_{INP}$ are selected from the signals $V_{IN(1)}$, $V_{IN(2)}$, ..., $V_{IN(N)}$ and $V_{REF0}$. For example, the multiplexer 210 includes a set of switching channels to deliver two signals selected from the signals $V_{IN(1)}$, $V_{IN(2)}$, ..., $V_{IN(N)}$ and $V_{REF0}$ to the signal filter 202. The set of switching channels can have various structures. In one embodiment, the multiplexer 210 turns on two switching channels to deliver the signals $V_{IN(1)}$ and $V_{REF0}$ to the signal filter 202, such that the signal filter 202 receives a differential input signal $V_{IN(1)}-V_{REF0}$, e.g., the cell voltage $V_1$. Similarly, the multiplexer 210 can turn on the switching channels sequentially, such that the signal filter 202 can receive the cells voltages $V_1$, $V_2$, ..., $V_N$ sequentially.

The signal filter 202 includes an input terminal INP1 to receive a first input signal $V_{INP}$, an input terminal INN1 to receive a second input signal $V_{INN}$, an output terminal OUTN1 to provide an output signal $V_{OUTN}$, and an output terminal OUTP1 to provide an output signal $V_{OUTP}$. The signal filter 202 receives a differential input signal that is equal to the difference between the input signals $V_{INN}$ and $V_{INP}$, and generates a differential output signal that is equal to the difference between the output signals $V_{OUTN}$ and $V_{OUTP}$. The differential output signal $V_{OUTP}-V_{OUTN}$ indicates the differential input signal $V_{INP}-V_{INN}$, e.g., the difference $V_{OUTP}-V_{OUTN}$ is proportional to the difference $V_{INP}-V_{INN}$. The ADC 220 receives the differential output signal $V_{OUTP}-V_{OUTN}$ and generates a digital signal 226 indicative of the differential output signal $V_{OUTP}-V_{OUTN}$, which also indicates the differential input signal $V_{INP}-V_{INN}$.

In one embodiment, the signal generator 230 can be a clock signal generator that includes one or more oscillators to generate control signals such as clock signals CLK1 and CLK2 to control the signal filter 202. The clock signals CLK1 and CLK2 control a dominant pole (or a first pole) $f_{p0}$ of the signal filter 202 according to a status of the differential input signal $V_{INP}-V_{INN}$. In the example of FIG. 2, the signal generator 230 is arranged outside of the signal filter 202. However, the signal generator 230 can instead be arranged inside the signal filter 202.

Advantageously, a differential output range of the signal filter 202 can be controlled such that the signal monitoring system 250 can fully utilize a differential input range of the ADC 220 and decrease the differential input range of the ADC 220, so as to enhance the measurement precision of the ADC 220. Furthermore, the response speed of the signal monitoring system 250, e.g., the speed at which the output signals $V_{OUTN}$ and $V_{OUTP}$ vary in response to variations in the input signals $V_{INN}$ and $V_{INP}$, increases. The monitoring accuracy of the signal monitoring system 250, e.g., the accuracy of the digital signal 226 indicating the difference between the input signals $V_{INN}$ and $V_{INP}$, is also improved.

More specifically, in one embodiment, the signal filter 202 receives the first and second input signals $V_{INP}$ and $V_{INN}$, and generates a first output signal $V'_{INN}$ and a second output signal $V'_{INP}$ (not shown in FIG. 2) according to the input signals $V_{INN}$ and $V_{INP}$ and according to a reference signal $V_{REFH}$ and a reference signal $V_{REFL}$. The reference signals $V_{REFH}$ and $V_{REFL}$ can be provided by reference signal sources (not shown in FIG. 2) implemented inside or outside of the signal filter 202. The signal filter 202 controls a voltage level of the output signal $V'_{INN}$ and a voltage level of the output signal $V'_{INP}$, such that the difference between the output signals $V'_{INN}$ and $V'_{INP}$ is equal to the difference between the input signals $V_{INN}$ and $V_{INP}$ minus the difference between the reference signals $V_{REFH}$ and $V_{REFL}$. In other words, the difference between the output signals $V'_{INN}$ and $V'_{INP}$ can be given by:

$$V'_{INP}-V'_{INN}=(V_{INP}-V_{INN})-(V_{REFH}-V_{REFL}). \quad (1)$$

In one embodiment, the signal filter 202 receives a differential input signal $V_{INP}-V_{INN}$, transforms the differential input signal $V_{INP}-V_{INN}$ into a differential signal $V'_{INP}-V'_{INN}$, and generates a differential output signal $V_{OUTP}-V_{OUTN}$ that is equal to the differential signal $V'_{INP}-V'_{INN}$ multiplied by a gain $g_{202}$ of the signal filter 202. According to equation (1), the differential output signal $V_{OUTP}-V_{OUTN}$ can be given by:

$$V_{OUTP}-V_{OUTN}=[(V_{INP}-V_{INN})-(V_{REFH}-V_{REFL})]*g_{202}. \quad (2)$$

Thus, the differential output range of the signal filter 202 is controlled by the reference signals $V_{REFH}$ and $V_{REFL}$. $V_{COM}$ can be an output common-mode voltage of the signal filter 202, e.g., $V_{COM}=(V_{OUTP}+V_{OUTN})/2$. Therefore, the voltage levels of the output signals $V_{OUTP}$ and $V_{OUTN}$ can be respectively given by:

$$V_{OUTP}=V_{COM}+[(V_{INP}-V_{INN})-(V_{REFH}-V_{REFL})]*g_{202}/2; \quad (3a)$$

$$V_{OUTN}=V_{COM}-[(V_{INP}-V_{INN})-(V_{REFH}-V_{REFL})]*g_{202}/2. \quad (3b)$$

Ranges of the output signals $V_{OUTP}$ and $V_{OUTN}$ thus are controlled by the output common-mode voltage $V_{COM}$ and the reference signals $V_{REFH}$ and $V_{REFL}$.

In one embodiment, the reference signals $V_{REFH}$ and $V_{REFL}$ are set such that the difference $V_{REFH}-V_{REFL}$ is within the range of the differential input signal $V_{INP}-V_{INN}$. Accordingly, the maximum absolute value of the difference $V'_{INP}-V'_{INN}$, e.g., the maximum of the level $|V'_{INP}-V'_{INN}|$, is less than the maximum absolute value of the difference $V_{INP}-V_{INN}$, e.g., the maximum of the level $|V_{INP}-V_{INN}|$. As such, the differential input range of the ADC 220 can be reduced. By way of example, the differential input signal $V_{INP}-V_{INN}$ ranges from 0V to a maximum level $V_{MAX}$. The reference signals $V_{REFH}$ and $V_{REFL}$ are set such that the difference $V_{REFH}-V_{REFL}$ is equal to half of the maximum level $V_{MAX}$, e.g., $V_{REFH}-V_{REFL}=V_{MAX}/2$. Thus, according to equations (1) and (2), the following equation is obtained:

$$V_{OUTP}-V_{OUTN}=[(V_{INP}-V_{INN})-V_{MAX}/2]*g_{202}. \quad (4)$$

Figure 1:
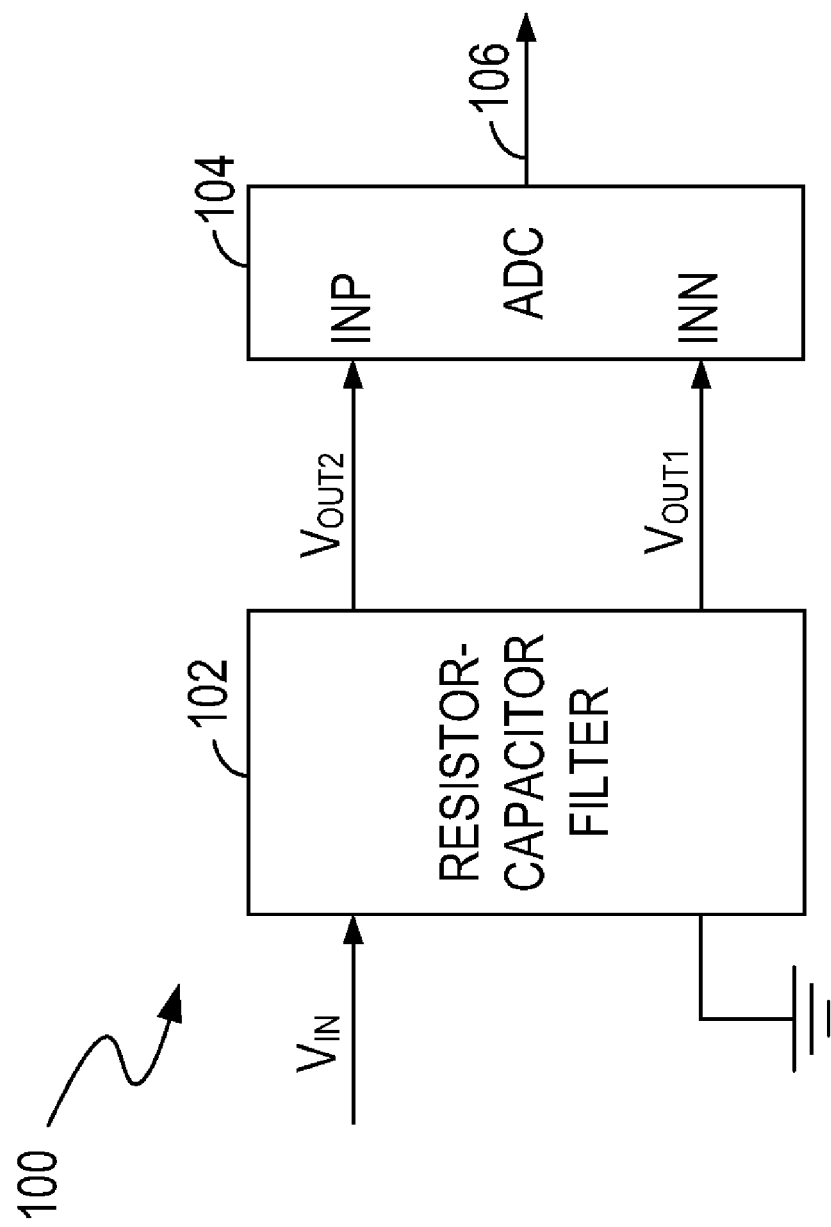
FIG. 1 illustrates a conventional signal monitoring system.

Since the differential input signal $V_{INP}-V_{INN}$ ranges from 0V to the maximum level $V_{MAX}$, the differential output signal $V_{OUTP}-V_{OUTN}$ can range from the level $-(V_{MAX}/2)*g_{202}$ to the level $(V_{MAX}/2)*g_{202}$. If the gain $g_{202}$ of the signal filter 202 is equal to one and the maximum level $V_{MAX}$ is equal to 5V, then the differential output signal $V_{OUTP}-V_{OUTN}$ ranges from −2.5V to 2.5V. Thus, the differential input range of the ADC 220 can be set to be at least from −2.5V to 2.5V. As such, the differential input range of the ADC 220 is fully utilized. If the ADC 220 is a 12-bit ADC, the least significant bit (LSB) of the ADC 220 is given by: LSB=$2.5/2^{11}$=1.22 mV. Compared with the ADC 104 of the conventional signal monitoring system 100 in FIG. 1, the ADC 220 in FIG. 2 has a smaller differential input range and a smaller LSB. As a result, the ADC 220 can more accurately measure the differential output signal $V_{OUTP}-V_{OUTN}$.

In one such embodiment, the ADC 220 generates a digital signal $DIG_{IN}$ representative of the differential output signal $V_{OUTP}-V_{OUTN}$, and generates the digital signal 226 that is equal to the digital signal $DIG_{IN}$ plus a reference digital signal $DIG_{REF}$. The reference digital signal $DIG_{REF}$ represents the difference $V_{REFH}-V_{REFL}$. Thus, the digital signal 226 represents the differential input signal $V_{INP}-V_{INN}$.

In one embodiment, the signal filter 202 includes a switched-capacitor circuit. A control signal SCF_CLK selected from the clock signals CLK1 and CLK2 controls, e.g., alternately turns on and off, switches in the switched-capacitor circuit, so as to provide an equivalent resistance $R_{SC}$. The switched-capacitor circuit can have various structures and the equivalent resistance $R_{SC}$ of the switched-capacitor circuit is given by:

$$R_{SC}=1/(C_{SC}*f_{CLK}), \quad (5)$$

where $C_{SC}$ represents a capacitance parameter in the switched-capacitor circuit, and $f_{CLK}$ represents the frequency of the control signal SCF_CLK that controls the switches in the switched-capacitor circuit.

Furthermore, in one such embodiment, the signal filter 202 is a low-pass filter. According to the characteristics of a low-pass filter, the dominant pole $f_{p0}$ of the signal filter 202 can be given by:

$$f_{p0}=1/(2\pi*R_{EQV}*C_{EQV}), \quad (6)$$

where $R_{EQV}$ represents an equivalent resistance of the signal filter 202, and $C_{EQV}$ represents an equivalent capacitance of the signal filter 202. The equivalent resistance $R_{EQV}$ of the signal filter 202 is provided by the switched-capacitor circuit, and therefore is equal to the equivalent resistance $R_{SC}$ of the switched-capacitor circuit. Based on equations (5) and (6), the following equation is obtained:

$$f_{p0}=f_{CLK}*C_{SC}/(2\pi*C_{EQV}). \quad (7)$$

Thus, the dominant pole $f_{p0}$ of the signal filter 202 increases if the frequency $f_{CLK}$ increases, and decreases if the frequency $f_{CLK}$ decreases. The signal generator 230 can increase the frequency $f_{CLK}$ of the control signal SCF_CLK to increase the dominant pole $f_{p0}$ of the signal filter 202, and therefore to increase the bandwidth of the signal filter 202. The signal generator 230 can also decrease the frequency $f_{CLK}$ to decrease the dominant pole $f_{p0}$, and therefore to decrease the bandwidth of the signal filter 202.

Figure 3A:
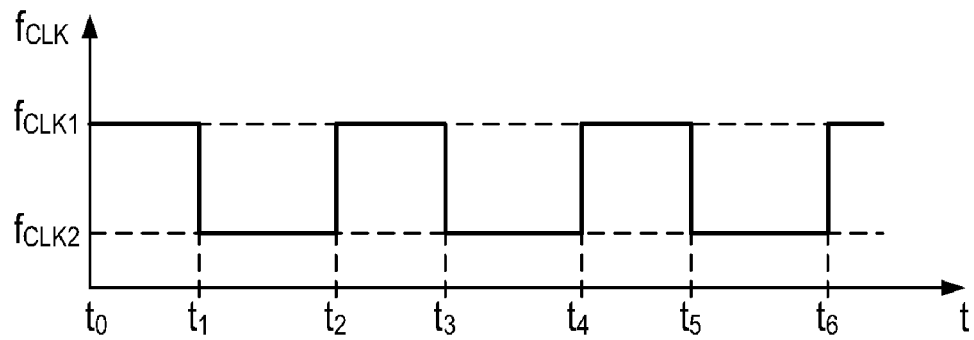
FIGS. 3A to 3C illustrate frequency diagrams of examples of a clock signal, in accordance with embodiments of the present invention.

FIG. 3A illustrates a frequency diagram of an example of the control signal SCF_CLK that controls the switches in the signal filter 202, in accordance with one embodiment of the present invention. FIG. 3A is described in combination with FIG. 2.

As shown in FIG. 3A, the frequency $f_{CLK}$ of the control signal SCF_CLK can have a frequency $f_{CLK1}$ and a frequency $f_{CLK2}$ that is less than the frequency $f_{CLK1}$. By way of example, the signal generator 230 selects the control signal SCF_CLK from the clock signals CLK1 and CLK2 to control the dominant pole $f_{p0}$ of the signal filter 202 according to the status of the differential input signal $V_{INP}-V_{INN}$. The clock signal CLK1 has the frequency $f_{CLK1}$, and the clock signal CLK2 has the frequency $f_{CLK2}$. The multiplexer 210 can select and deliver a cell voltage from the cell voltages $V_1$, $V_2$, ..., $V_N$ to the signal filter 202 sequentially, such that the signal monitoring system 250 can monitor each of the cell voltages $V_1$, $V_2$, ..., $V_N$. In one embodiment, when the differential input signal $V_{INP}-V_{INN}$ is switched from a first signal (e.g., the cell voltage $V_1$) to a second signal (e.g., the cell voltage $V_2$), e.g., at time $t_0$, the signal generator 230 selects the clock signal CLK1 that has the frequency $f_{CLK1}$ to control the signal filter 202. The signal generator 230 can include a timer to count time. When a preset time interval $T_{PRE1}$ expires, e.g., at time $t_1$, the signal generator 230 selects the clock signal CLK2 that has the frequency $f_{CLK2}$ to control the signal filter 202. When a preset time interval $T_{PRE2}$ expires, e.g., at time $t_2$, the differential input signal $V_{INP}-V_{INN}$ can be switched from the second signal (e.g., the cell voltage $V_2$) to a third signal (e.g., the cell voltage $V_3$). At time $t_2$, the signal generator 230 selects the clock signal CLK1 to control the signal filter 202 again. As a result, when the differential input signal $V_{INP}-V_{INN}$ is switched from one signal to another signal, the signal filter 202 can increase its bandwidth to increase the response speed. When the preset time interval $T_{PRE1}$ expires, the signal filter 202 can decrease its bandwidth to enhance the accuracy of the ADC 220.

Figure 3B:
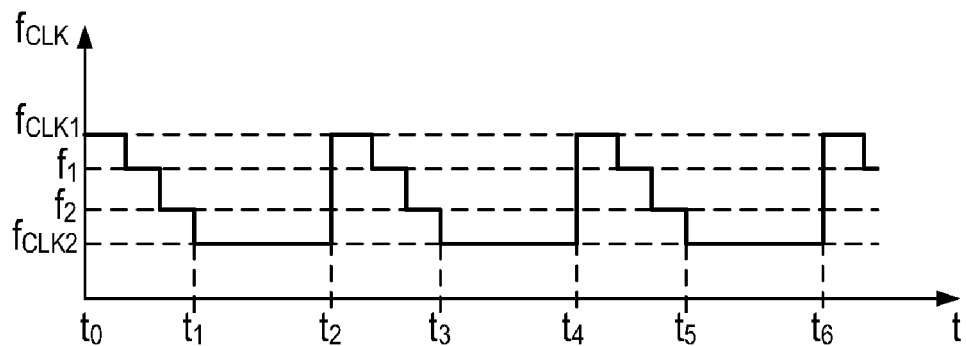
Figure 3C:
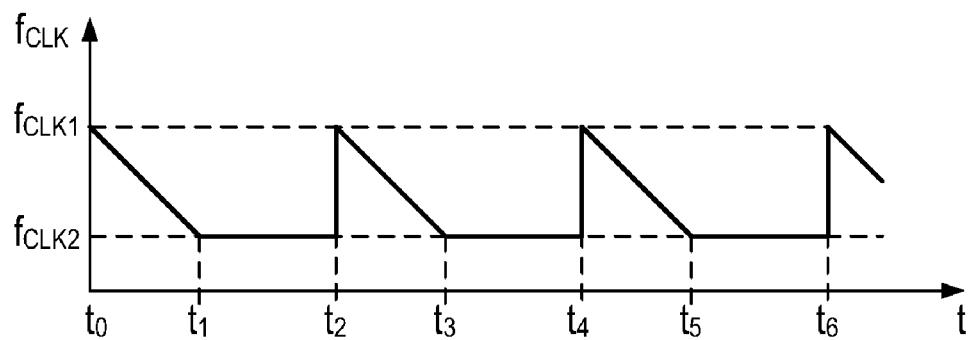

In one embodiment, the signal generator 230 selects the control signal SCF_CLK from the clock signals CLK1 and CLK2 to control the signal filter 202. However, the invention is not so limited. FIG. 3B and FIG. 3C illustrate frequency diagrams of other examples of the control signal SCF_CLK, in accordance with embodiments of the present invention. FIG. 3B and FIG. 3C are described in combination with FIG. 2.

In the example of FIG. 3B, the signal generator 230 selects the control signal SCF_CLK from three or more clock signals that have different frequencies, e.g., $f_{CLK1}$, $f_1$, $f_2$, and $f_{CLK2}$, to control the signal filter 202. In the example of FIG. 3C, the signal generator 230 controls the control signal SCF_CLK to have a higher frequency $f_{CLK1}$ when the differential input signal $V_{INP}-V_{INN}$ is switched from one signal to another signal, e.g., at time $t_0$, $t_2$, $t_4$, etc., and then decreases the frequency of the control signal SCF_CLK to a lower frequency $f_{CLK2}$ continuously as shown in FIG. 3C.

Figure 4A:
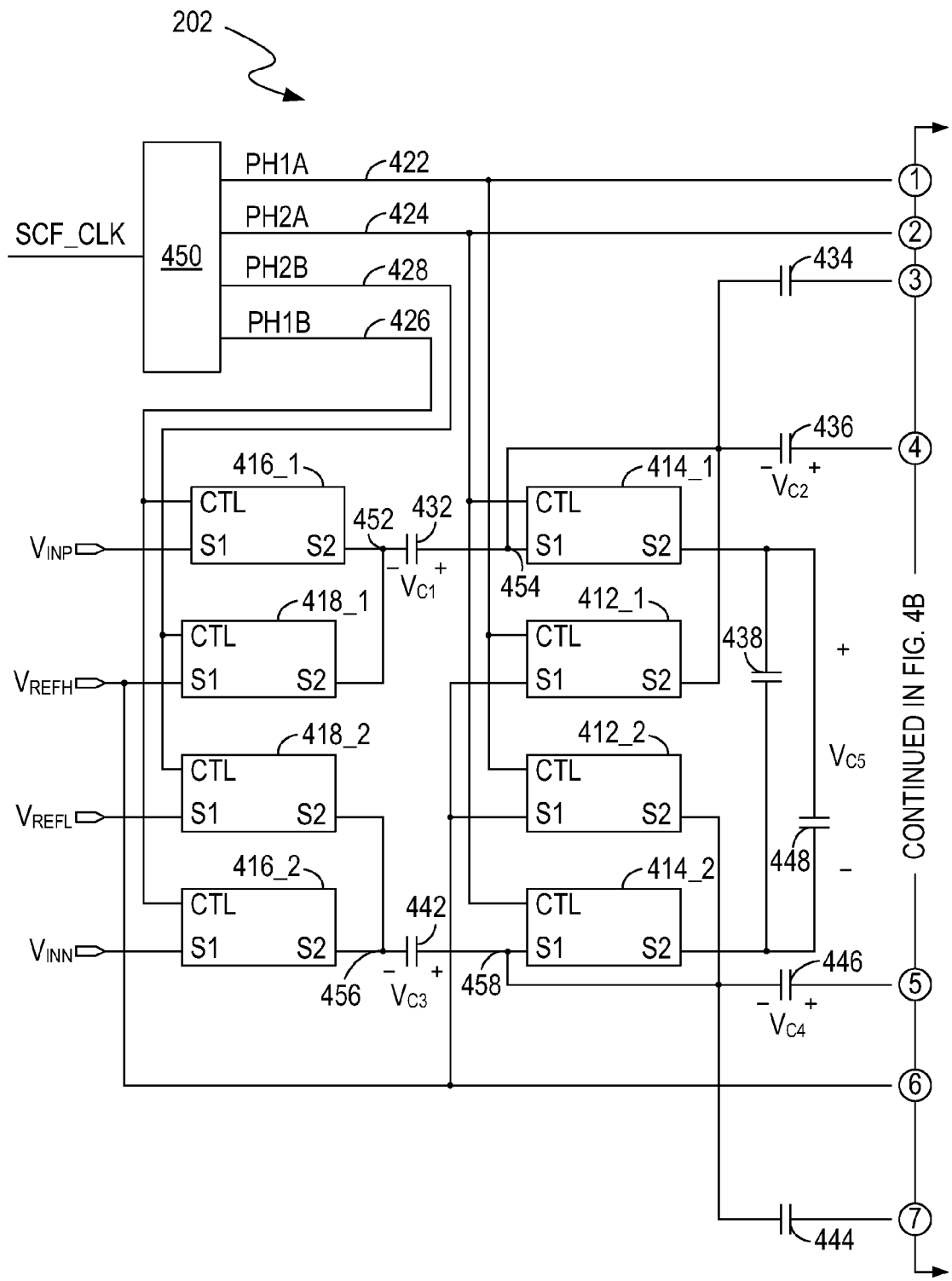
FIGS. 4A and 4B illustrate a circuit diagram of an example of a switched-capacitor filter, in accordance with one embodiment of the present invention.
Figure 4B:
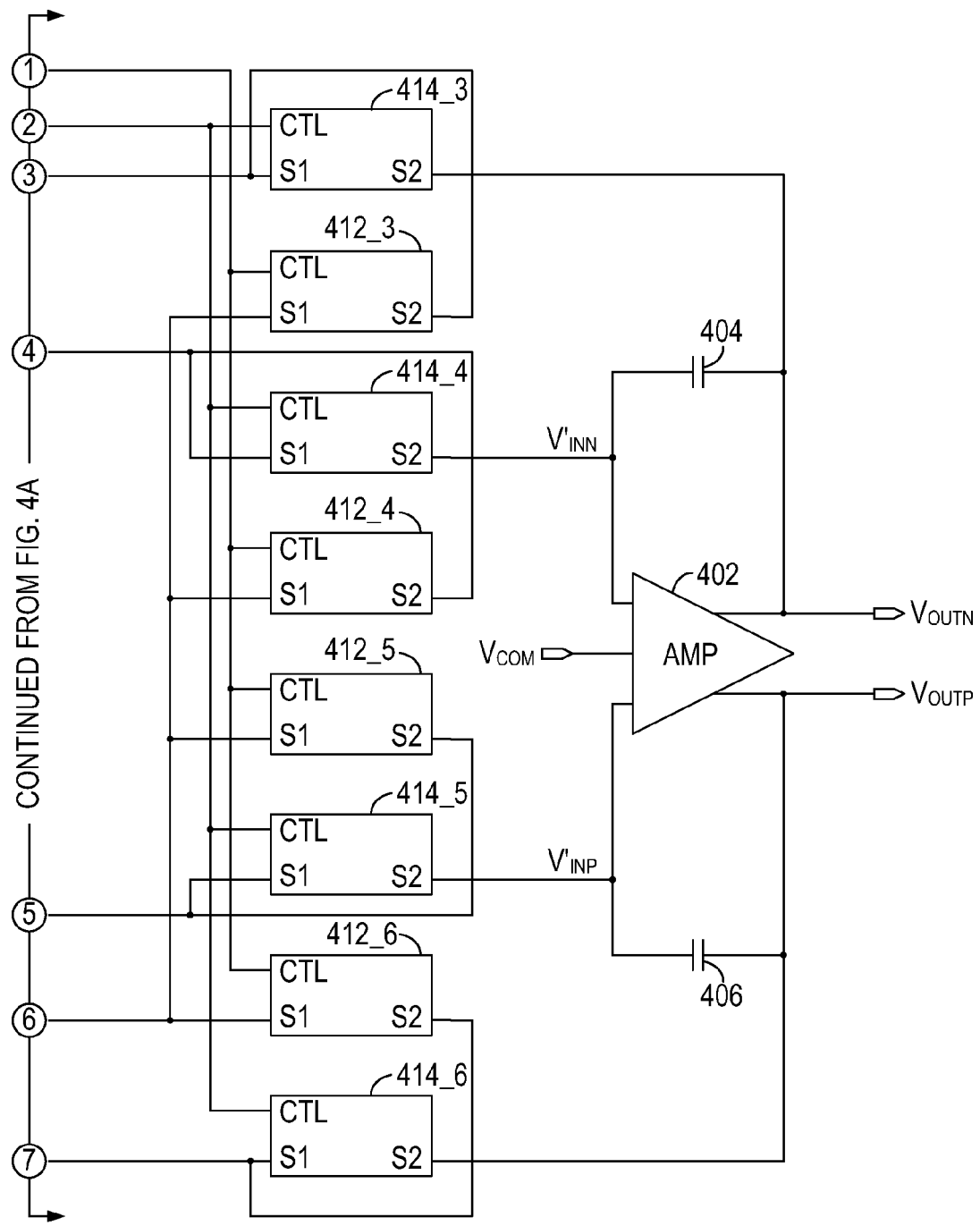

FIGS. 4A and 4B illustrate a circuit diagram of an example of the signal filter 202 in FIG. 2, in accordance with one embodiment of the present invention. The signal filter 202 includes filter circuitry and a differential amplification circuitry 402 coupled to the filter circuitry. The filter circuitry includes multiple switches 416_1-416_2, 418_1-418_2, 412_1-412_6 and 414_1-414_6, multiple capacitors 432, 442, 434, 444, 436, 446, 438, 448, 404 and 406, and a set of signal lines 422, 424, 428 and 426.

As shown in FIGS. 4A and 4B, each switch of the switches 416_1-416_2, 418_1-418_2, 412_1-412_6 and 414_1-414_6 includes a control terminal labeled "CTL" (hereinafter, CTL terminal), a terminal labeled "S1" (hereinafter, S1 terminal), and a terminal labeled "S2" (hereinafter, S2 terminal). A control signal at the CTL terminal can control the status of the switch. For example, if the control signal is logic high, the switch is turned on and a signal can be transferred between the S1 terminal and the S2 terminal. If the control signal is logic low, the switch is turned off.

A first end 452 of the capacitor 432 is coupled to receive the input signal $V_{INP}$ via the switch 416_1 and is coupled to receive the reference signal $V_{REFH}$ via the switch 418_1. A second end 454 of the capacitor 432 is coupled to receive a reference signal, e.g., the reference signal $V_{REFH}$ or another reference signal $V'_{REF}$ not shown in FIG. 4A, via the switch 412_1, and is coupled to provide the output signal $V'_{INN}$ via the capacitor 436 and the switch 414_4. A first end 456 of the capacitor 442 is coupled to receive the input signal $V_{INN}$ via the switch 416_2 and is coupled to receive the reference signal $V_{REFL}$ via the switch 418_2. A second end 458 of the capacitor 442 is coupled to receive the same reference signal that is received by the switch 412_1, e.g., the reference signal $V_{REFH}$ or the reference signal $V'_{REF}$ not shown in FIG. 4A, via the switch 412_2, and is coupled to provide the output signal $V'_{INP}$ via the capacitor 446 and the switch 414_5. In addition, two ends of each of the capacitors 434, 436, 446 and 444 are coupled to receive the same reference signal that is received by the switches 412_1 and 412_2, e.g., the reference signal $V_{REFH}$ or the reference signal $V'_{REF}$ not shown in FIG. 4A, via corresponding switches 412_1-412_6. The capacitors 434 and 444 are also coupled to receive feedback signals $V_{OUTN}$ and $V_{OUTP}$ via the switches 414_3 and 414_6 respectively. The switches 414_1 and 414_2 are coupled to control the capacitors 438 and 448.

The filter circuitry receives the input signals $V_{INN}$ and $V_{INP}$ and the reference signals $V_{REFH}$ and $V_{REFL}$ through input capacitors 432 and 442, and receives feedback signals $V_{OUTN}$ and $V_{OUTP}$ through feedback capacitors 434 and 444. The filter circuitry further generates the output signals $V'_{INN}$ and $V'_{INP}$ in accordance with equation (1). The differential amplification circuitry 402 receives the outputs signals $V'_{INN}$ and $V'_{INP}$ and generates the output signals $V_{OUTN}$ and $V_{OUTP}$ in accordance with equations (3a) and (3b).

In one embodiment, the signal filter 202 receives the control signal SCF_CLK to control the switches 416_1-416_2, 418_1-418_2, 412_1-412_6 and 414_1-414_6, such that the signal filter 202 receives the input signal $V_{INP}$ and the reference signal $V_{REFH}$ via the node 452 in alternating fashion and generates the output signal $V'_{INN}$ determined by the input signal $V_{INP}$ and the reference signal $V_{REFH}$. The signal filter 202 can also receive the input signal $V_{INN}$ and the reference signal $V_{REFL}$ via the node 456 in alternating fashion and generates the output signal $V'^{INP}$ determined by the input signal $V_{INN}$ and the reference signal $V_{REFL}$. Accordingly, the difference between the output signals $V'_{INP}$ and $V'_{INN}$ can be given by equation (1). Moreover, the signal filter 202 receives the differential input signal $V_{INP}-V_{INN}$ and the differential output signal $V_{OUTP}-V_{OUTN}$ in alternating fashion, such that an equivalent resistance of the signal filter 202 is controlled by the frequency at which the differential input signal $V_{INP}-V_{INN}$ and the differential output signal $V_{OUTP}-V_{OUTN}$ alternate, e.g., the frequency $f_{CLK}$ of the control signal SCF_CLK, in accordance with equation (5). Accordingly, the dominant pole $f_{p0}$ of the signal filter 202 is controlled by controlling the frequency $f_{CLK}$ of the control signal SCF_CLK.

More specifically, the switches 416_1 and 416_2 are coupled to the signal line 426 and controlled by a clock signal PH1B at the signal line 426. The switches 418_1 and 418_2 are coupled to the signal line 428 and controlled by a clock signal PH2B at the signal line 428. The switches 412_1-412_2 (in FIG. 4A) and the switches 412_3-412_6 (in FIG. 4B) are coupled to the signal line 422 and controlled by a clock signal PH1A at the signal line 422. The switches 414_1-414_2 (in FIG. 4A) and the switches 414_3-414_6 (in FIG. 4B) are coupled to the signal line 424 and controlled by a clock signal PH2A at the signal line 424.

A non-overlapping clock generator 450 can receive the control signal SCF_CLK, e.g. a clock signal, and generate clock signals PH1A, PH2A, PH1B and PH2B with the frequency $f_{CLK}$ of the control signal SCF_CLK or with a frequency that is directly proportional to the frequency $f_{CLK}$. The non-overlapping clock generator 450 also controls phase differences between the clock signals PH1A, PH2A, PH1B and PH2B. Examples of waveforms of the clock signals PH1A, PH2A, PH1B and PH2B are illustrated in FIG. 5, in accordance with one embodiment of the present invention.

Figure 5:
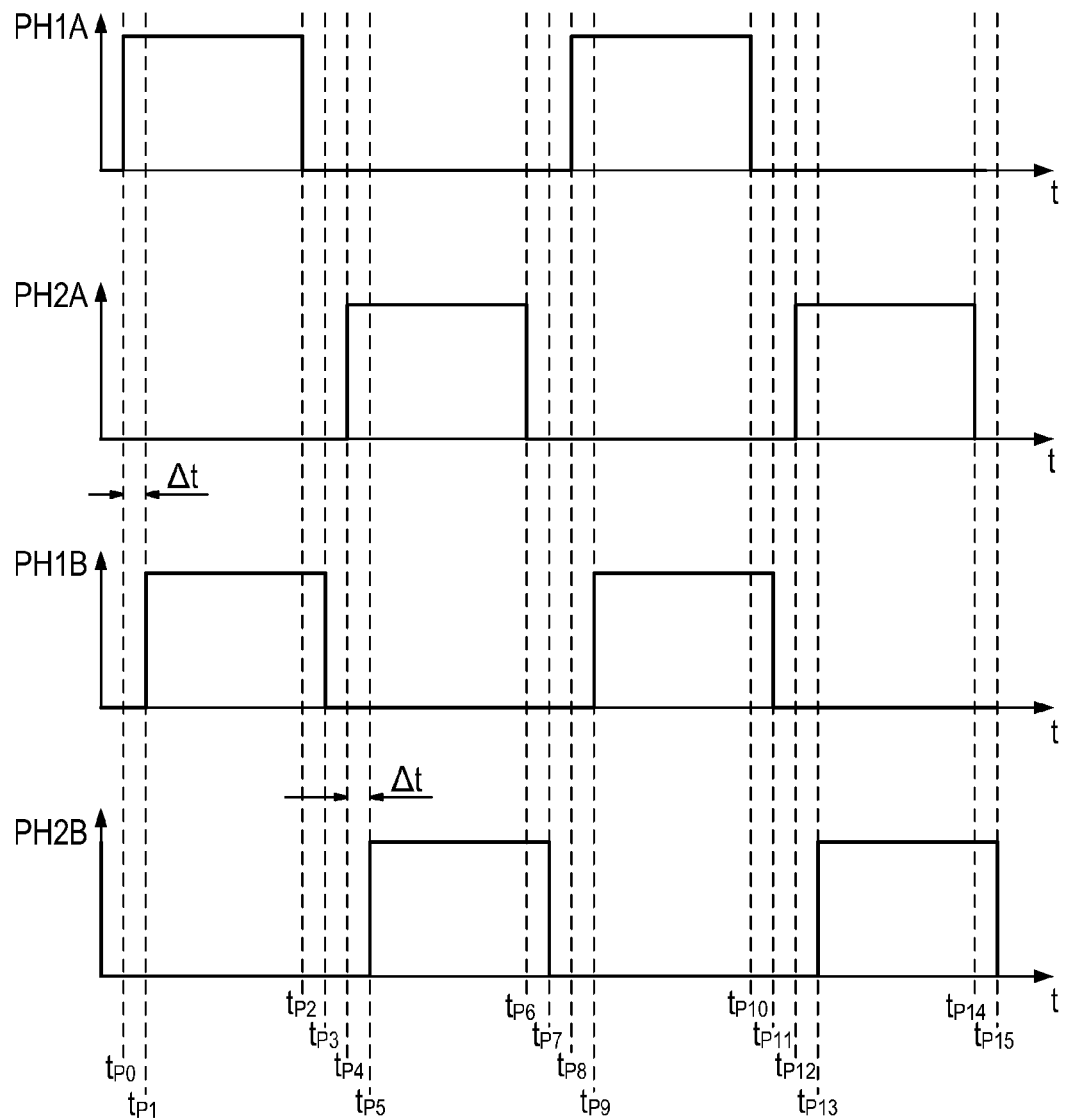
FIG. 5 illustrates waveform diagrams of examples of clock signals. in accordance with one embodiment of the present invention.

As shown in FIG. 5, the clock signals PH1A and PH2A are a pair of non-overlapping signals, and the clock signals PH1B and PH2B are a pair of non-overlapping signals. More specifically, if the clock signal PH1A is logic high, the clock signal PH2A is logic low; if the clock signal PH2A is logic high, the clock signal PH1A is logic low. Similarly, if the clock signal PH1B is logic high, the clock signal PH2B is logic low; if the clock signal PH2B is logic high, the clock signal PH1B is logic low. In addition, the clock signal PH1B is a delayed version of the clock signal PH1A, and the clock signal PH2B is a delayed version of the clock signal PH2A. By way of example, a rising edge of the clock signal PH1A occurs at time $t_{P0}$, and a corresponding rising edge of the clock signal PH1B occurs at time $t_{P1}$ that is $\Delta t$ delayed from the time $t_{P0}$. In addition, the clock signals PH1A and PH1B have the same duty cycle. Similarly, a rising edge of the clock signal PH2A occurs at time $t_{P4}$, and a corresponding rising edge of the clock signal PH2B occurs at time $t_{P5}$ that is $\Delta t$ delayed from the time $t_{P4}$. In addition, the clock signals PH2A and PH2B have the same duty cycle. Compared with cycle times of the clock signals PH1A, PH2A, PH1B and PH2B, the delayed time $\Delta t$ is relatively short.

Figure 6A:
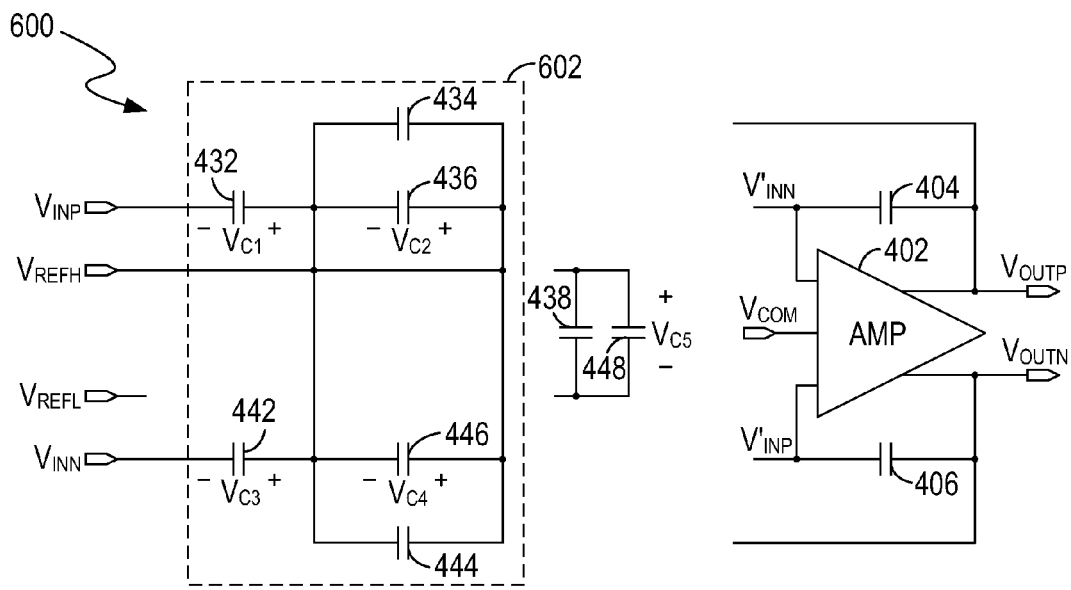
FIGS. 6A and 6B illustrate diagrams of examples of equivalent circuits of the switched-capacitor filter in FIGS. 4A and 4B, in accordance with one embodiment of the present invention.

During time interval $t_{P1}$ to $t_{P2}$, the clock signals PH1A and PH1B are logic high, and the clock signals PH2A and PH2B are logic low. Accordingly, the switches 416_1-416_2 and the switches 412_1-412_6 are on, and the switches 418_1-418_2 and the switches 414_1-414_6 are off. An example of an equivalent circuit 600 of the signal filter 202 during the time interval $t_{P1}$ to $t_{P2}$ is shown in FIG. 6A. During the time interval $t_{P5}$ to $t_{P6}$, the clock signals PH1A and PH1B are logic low, and the clock signals PH2A and PH2B are logic high. Accordingly, the switches 416_1-416_2 and the switches 412_1-412_6 are off, and the switches 418_1-418_2 and the switches 414_1-414_6 are on. An example of an equivalent circuit 600' of the signal filter 202 during the time interval $t_{P5}$ to $t_{P6}$ is shown in FIG. 6B.

As shown in FIG. 6A, during time interval $t_{P1}$ to $t_{P2}$, the capacitor 432 receives the input signal $V_{INP}$ via the first end 452 of the capacitor 432 and receives the reference signal $V_{REFH}$ via the second end 454 of the capacitor 432. A voltage $V_{C1}$ across the capacitor 432 is equal to the difference between the reference signal $V_{REFH}$ and the input signal $V_{INP}$, e.g., $V_{C1}=V_{REFH}-V_{INP}$. The capacitor 442 receives the input signal $V_{INN}$ via the first end 456 of the capacitor 442 and receives the reference signal $V_{REFH}$ via the second end 458 of capacitor 442. A voltage $V_{C3}$ across the capacitor 442 is equal to the difference between the reference signal $V_{REFH}$ and the input signal $V_{INN}$, e.g., $V_{C3}=V_{REFH}-V_{INN}$. In addition, two ends of each of the capacitors 434, 436, 446 and 444 receive the reference signal $V_{REFH}$. Voltages across the capacitors 434, 436, 446 and 444 are zero volts.

Figure 6B:
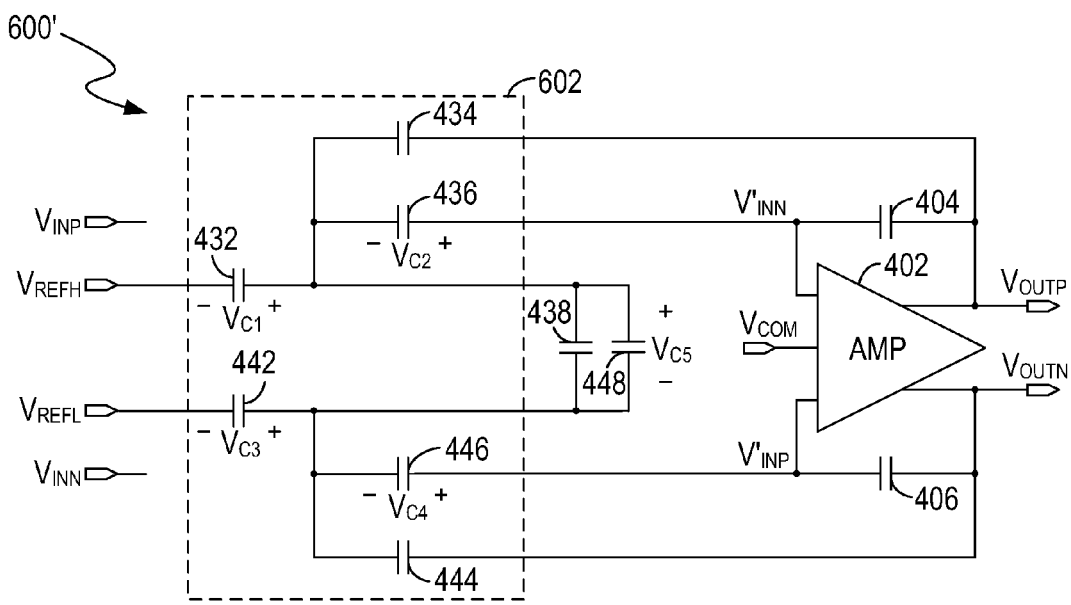

As shown in FIG. 6B, during time interval $t_{P5}$ to $t_{P6}$, the capacitor 432 receives the reference signal $V_{REFH}$ via the first end 452 of the capacitor 432 and provides the output signal $V'_{INN}$ which is transferred to the differential amplification circuitry 402 via the second end 454 of the capacitor 432 and via the capacitor 436. The capacitor 442 receives the reference signal $V_{REFL}$ via the first end 456 of the capacitor 442 and provides the output signal $V'_{INP}$ which is transferred to the differential amplification circuitry 402 via the second end 458 of the capacitor 442 and via the capacitor 446. More specifically, since the voltage $V_{C1}$ of the capacitor 432 and the voltage $V_{C2}$ of the capacitor 436 do not change abruptly, the voltage at the second end 454 of the capacitor 432 can be equal to the reference signal $V_{REFH}$ plus the level $V_{REFH}-V_{INP}$, and the output signal $V'_{INN}$ can be equal to the level $V_{REFH}+V_{REFH}-V_{INP}$ plus zero volts. In other words, the output signal $V'_{INN}$ can be given by:

$$V'_{INN}=2*V_{REFH}-V_{INP}. \quad (8)$$

Similarly, the voltage at the second end 458 of the capacitor 442 can be equal to the reference signal $V_{REFL}$ plus the level $V_{REFH}-V_{INN}$, and the output signal $V'_{INP}$ can be equal to the level $V_{REFL}+V_{REFH}-V_{INP}$ plus zero volts. In other words, the output signal $V'_{INP}$ can be given by:

$$V'_{INP}=V_{REFL}+V_{REFH}-V_{INN}. \quad (9)$$

As a result, the difference between the output signals $V'_{INN}$ and $V'_{INP}$ is obtained in accordance with equation (1).

In other words, in one embodiment, the node 452 of the energy storage circuitry 602 receives the input signal $V_{INP}$ and the reference signal $V_{REFH}$ selectively. The node 456 of the energy storage circuitry 602 can receive input signal $V_{INN}$ and the reference signal $V_{REFL}$ selectively. The S2 terminal of the switch 414_4 provides the output signal $V'_{INN}$ determined by the input signal $V_{INP}$ and the reference signal $V_{REFH}$. The S2 terminal of the switch 414_5 provides the output signal $V'_{INP}$ determined by the input signal $V_{INN}$ and the reference signal $V_{REFL}$. The S2 terminal of the switch 414_3 receives the feedback signal $V_{OUTN}$ indicative of the output signal $V'_{INN}$. The S2 terminal of the switch 414_6 receives the feedback signal $V_{OUTP}$ indicative of the output signal $V'_{INP}$. The energy storage circuitry 602 generates the output signal $V'_{INN}$ at the S2 terminal of the switch 414_4 and the output signal $V'_{INP}$ at the S2 terminal of the switch 414_5. The difference between the output signals $V'_{INN}$ and $V'_{INP}$ is obtained in accordance with equation (1).

Although, in the examples of FIGS. 4A and 4B, and FIGS. 6A and 6B, the second end 454 of the capacitor 432, the second end 458 of the capacitor 442, and the four ends of the capacitors 436 and 446 receive the reference signal $V_{REFH}$ in the first time interval, e.g., $t_{P1}$ to $t_{P2}$, the invention is not so limited. In another embodiment, in the first time interval e.g., $t_{P1}$ to $t_{P2}$, the first end 452 of the capacitor 432 receives the input signal $V_{INP}$, the first end 456 of the capacitor 442 receives the input signal $V_{INN}$. Additionally, the second end 454 of the capacitor 432, the second end 458 of the capacitor 442, and the four ends of the capacitors 436 and 446 receive another reference signal $V'_{REF}$ instead of the reference signal $V_{REFH}$. In the second time interval, e.g., $t_{P5}$ to $t_{P6}$, the first end 452 of the capacitor 432 receives the reference signal $V_{REFH}$, and the first end 456 of the capacitor 442 receives the reference signal $V_{REFL}$. Additionally, the second end 454 of the capacitor 432 provides the output signal $V'_{INN}$ via the capacitor 436, and the second end 458 of the capacitor 442 provides the output signal $V'_{INP}$ via the capacitor 446. In one such embodiment, the following equation can be obtained:

$$V'_{INN}=V_{REFH}+V'_{REF}-V_{INP}, \text{ and} \quad (10)$$

$$V'_{INP}=V_{REFL}+V'_{REF}-V_{INN}. \quad (11)$$

The difference between the output signals $V'_{INN}$ and $V'_{INP}$ can also be obtained in accordance with equation (1).

Furthermore, the energy storage circuitry 602 can receive the input signal $V_{INP}$ via the node 452 and the feedback signal $V_{OUTP}$ via the S2 terminal of the switch 414_3 in alternating fashion, and receive the input signal $V_{INN}$ via the node 456 and the feedback signal $V_{OUTN}$ via the S2 terminal of the switch 414_6 in alternating fashion. As such, the dominant pole $f_{p0}$ of the signal filter 202 is controlled by the frequency at which the input signal $V_{INP}$ and the feedback signal $V_{OUTP}$ alternate or the frequency at which the input signal $V_{INN}$ and the feedback signal $V_{OUTN}$ alternate. By way of example, as shown in FIG. 6A, during the time interval $t_{P1}$ to $t_{P2}$, charge stored in the energy storage circuitry 602 that includes the capacitors 432, 442, 434, 444, 436 and 446 is controlled by the differential input signal $V_{INP}-V_{INN}$. For example, charge $Q_{SC}$ stored in the energy storage circuitry 602 is given by $C_{SC}*(V_{INP}-V_{INN})$. $C_{SC}$ represents a capacitive parameter in the energy storage circuitry 602. As shown in FIG. 6B, during the time interval $t_{P5}$ to $t_{P6}$, charge stored in the energy storage circuitry 602 is controlled by the differential output signal $V_{OUTP}-V_{OUTN}$. For example, charge $Q'_{SC}$ stored in the energy storage circuitry 602 is given by $C_{SC}*(V_{OUTP}-V_{OUTN})$. The control signal SCF_CLK can control the switches 416_1-416_2, 418_1-418_2, 412_1-412_6 and 414_1-414_6, such that charge stored in the energy storage circuitry 602 is controlled by the differential input signal $V_{INP}-V_{INN}$ and the differential output signal $V_{OUTP}-V_{OUTN}$ alternately with the frequency $f_{CLK}$. During a time cycle $T_{CLK}$, e.g., $1/f_{CLK}$, change $\Delta Q$ in the charge stored in the energy storage circuitry 602 is equal to $Q'_{SC}-Q_{SC}=C_{SC}*[(V_{OUTP}-V_{OUTN})-(V_{INP}-V_{INN})]$. Thus, an average current $I_{SC}$ through the energy storage circuitry 602 is equal to $\Delta Q/T_{CLK}=C_{SC}*f_{CLK}*[(V_{OUTP}-V_{OUTN})-(V_{INP}-V_{INN})]$. In addition, an equivalent resistance $R_{SC}$ in the energy storage circuitry 602 is equal to $[(V_{OUTP}-V_{OUTN})-(V_{INP}-V_{INN})]/I_{SC}$. Accordingly, the equivalent resistance $R_{SC}$ can be given by $R_{SC}=1/(C_{SC}*f_{CLK})$. As a result, the dominant pole $f_{p0}$ of the signal filter 202 is controlled by the frequency $f_{CLK}$.

In one embodiment, capacitances of the capacitors 438, 448, 404 and 406 can be equal to $C_0$, capacitances of the capacitors 432, 442, 434 and 444 can be equal to $0.5*C_1$, and capacitances of the capacitors 436 and 446 can be equal to $C_1$. In one such embodiment, the dominant pole $f_{p0}$ of the signal filter 202 can be given by:

$$f_{p0}=f_{CLK}*C_1/(4\pi\sqrt{2}*C_0), \quad (12)$$

where $f_{CLK}$ represents the switching frequency of the switches 416_1-416_2, 418_1-418_2, 412_1-412_6 and 414_1-414_6. Accordingly, the dominant pole $f_{p0}$ of the signal filter 202 can be controlled by controlling the frequency $f_{CLK}$ of the control signal SCF_CLK.

In the example of FIGS. 4A and 4B, the signal filter 202 includes the switches 418_2 and 416_2. However, in another embodiment, the switches 418_2 and 4162 can be omitted. In one such embodiment, the reference signal $V_{REFL}$ and the input signal $V_{INN}$ can be grounded. The signal filter 202 can receive a single-ended input signal $V_{INP}$ and generate a differential output signal $V_{OUTP}-V_{OUTN}$ indicative of the input signal $V_{INP}$.

Figure 7:
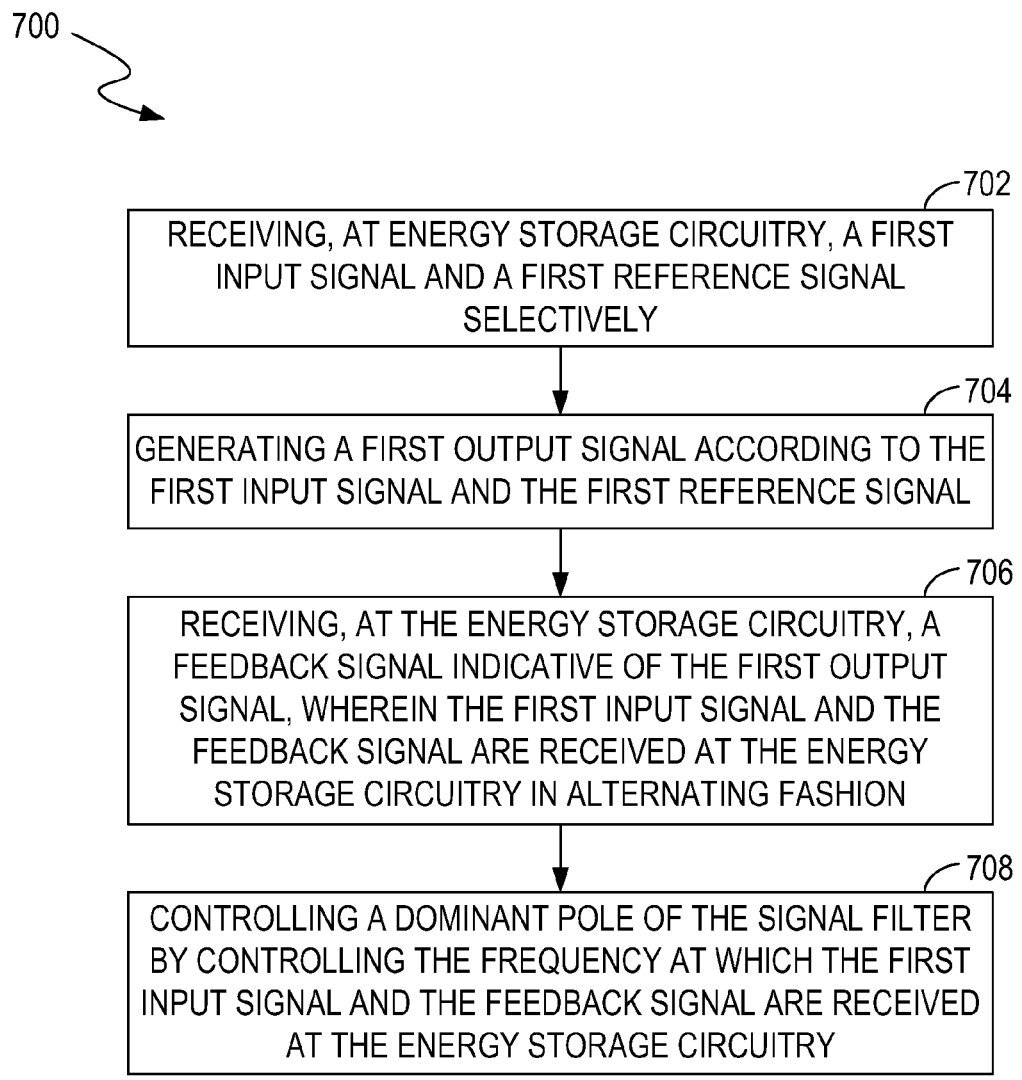
FIG. 7 illustrates a flowchart of examples of operations performed by a signal monitoring system, in accordance with one embodiment of the present invention.

FIG. 7 illustrates a flowchart 700 of examples of operations performed by a signal monitoring system, in accordance with one embodiment of the present invention. FIG. 7 is described in combination with FIG. 2, FIGS. 3A to 3C, FIGS. 4A and 4B, FIG. 5, and FIGS. 6A and 6B.

In block 702, the input signal $V_{INP}$ and the reference signal $V_{REFH}$ are received at the energy storage circuitry 602, e.g., at the node 452, selectively. The input signal $V_{INN}$ and the reference signal $V_{REFL}$ are also received at the energy storage circuitry 602, e.g., at the node 456, selectively.

In block 704, the output signal $V'_{INN}$ is generated, e.g., at the S2 terminal of the switch 414_4, according to the input signal $V_{INP}$ and the reference signal $V_{REFH}$, and the output signal $V'_{INP}$ is generated, e.g., at the S2 terminal of the switch 414_5, according to the input signal $V_{INN}$ and the reference signal $V_{REFL}$.

In block 706, the feedback signal $V_{OUTN}$ indicative of the output signal $V'_{INN}$ is received at the energy storage circuitry 602, e.g., at the S2 terminal of the switch 414_3, and the feedback signal $V_{OUTP}$ indicative of the output signal $V'_{INP}$ is received at the energy storage circuitry 602, e.g., at the S2 terminal of the switch 414_6. The input signal $V_{INP}$ and the feedback signal $V_{OUTN}$ are received at the energy storage circuitry 602 in alternating fashion, and the input signal $V_{INN}$ and the feedback signal $V_{OUTP}$ are received at the energy storage circuitry 602. In other words, the energy storage circuitry 602 receives the differential input signal $V_{INP}-V_{INN}$ and the differential feedback signal $V_{OUTP}-V_{OUTN}$ in alternating fashion.

In block 708, the dominant pole $f_{p0}$ of the signal filter 202 is controlled by controlling the frequency $f_{CLK}$ at which the differential input signal $V_{INP}-V_{INN}$ and the differential feedback signal $V_{OUTP}-V_{OUTN}$ are received at the energy storage circuitry 602.

Accordingly, in one embodiment, the present invention provides a signal monitoring system for monitoring an input signal. The signal monitoring system includes, in one embodiment, a switched-capacitor filter to filter the input signal and provides a differential output signal to an ADC. A clock signal controls switches in the signal filter, such that the differential output signal is controlled to be within a desired ranged for the ADC, and a dominant pole of the signal filter is controlled properly. The signal monitoring system can be used in various applications such as multiple-signal monitoring systems, battery monitoring systems, etc.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A signal monitoring system comprising:
   a signal filter operable for receiving a first input signal selected from a plurality of signals, operable for generating a first output signal according to said first input signal and a first reference signal, and operable for receiving a feedback signal indicative of said first output signal, said signal filter comprising a plurality of switches to deliver said first input signal and said reference signal to energy storage circuitry in said signal filter selectively, and deliver said first input signal and said feedback signal to said energy storage circuitry selectively; and
   a signal generator coupled to said signal filter and operable for generating a control signal to control said plurality of switches, operable for controlling a frequency of said control signal to control a dominant pole of said signal filter, operable for controlling said control signal to have a first frequency when said first input signal is switched from a first signal of said plurality of signals to a second signal of said plurality of signals, and operable for controlling said control signal to have a second frequency less than said first frequency when a time interval expires.

2. The signal monitoring system as claimed in claim 1, further comprising an analog-to-digital converter coupled to said signal filter and operable for generating a digital signal indicative of a difference between said first output signal and a second output signal of said signal filter.

3. The signal monitoring system as claimed in claim 1, wherein said energy storage circuitry comprises switched-capacitor circuitry.

4. The signal monitoring system as claimed in claim 1, wherein said control signal controls said switches so that, in a first time interval, a capacitor receives said first input signal via a first end of said capacitor and receives a second reference signal via a second end of said capacitor, and wherein in a second time interval, said capacitor receives said first reference signal via said first end and provides said first output signal via said second end.

5. The signal monitoring system as claimed in claim 1, wherein a difference between said first output signal and a second output signal of said signal filter is indicative of a difference between said first input signal and a second input signal of said signal filter minus a predetermined level that is within a range of said difference between said first and second input signals.

6. The signal monitoring system as claimed in claim 1, further comprising a multiplexer to select said first input signal from said plurality of signals.

7. A signal monitoring system for monitoring a plurality of signals, said signal monitoring system comprising:
   a node operable for receiving said first input signal and a first reference signal selectively, wherein said first input signal is selected from said plurality of signals;
   a first terminal operable for providing a first output signal determined by said first input signal and said first reference signal;
   a second terminal operable for receiving a feedback signal indicative of said first output signal; and
   a signal filter comprising energy storage circuitry coupled to said node and said first and second terminals, said energy storage circuitry operable for generating said first output signal at said first terminal according to said first input signal and said first reference signal, and operable for receiving said first input signal via said node and said feedback signal via said second terminal in alternating fashion, wherein a dominant pole of said signal filter is controlled by the frequency at which said first input signal and said feedback signal alternate, wherein said frequency has a first value when said first input signal is switched from a first signal of said plurality of signals to a second signal of said plurality of signals, and wherein said frequency signal has a second value less than said first value when a time interval expires.

8. The signal monitoring system as claimed in claim 7, further comprising an analog-to-digital converter coupled to said signal filter and operable for generating a digital signal indicative of a difference between said first output signal and a second output signal of said signal filter.

9. The signal monitoring system as claimed in claim 7, wherein said energy storage circuitry comprises switched-capacitor circuitry.

10. The signal monitoring system as claimed in claim 7, wherein said energy storage circuitry comprises a capacitor having a first end coupled to receive said first input signal via a first switch and coupled to receive said first reference signal via a second switch, said capacitor having a second end coupled to receive a second reference signal via a third switch and coupled to provide said first output signal via a fourth switch.

11. The signal monitoring system as claimed in claim 10, wherein in a first time interval, said first and third switches are turned on and said second and fourth switches are turned off, and wherein in a second time interval, said first and third switches are turned off and said second and fourth switches are turned on.

12. The signal monitoring system as claimed in claim 10, wherein said energy storage circuitry is operable for receiving said feedback signal via a fifth switch, and wherein said first and fifth switches are turned on in alternating fashion.

13. The signal monitoring system as claimed in claim 7, wherein a differential output signal of said signal filter is given by $V'_{INP}-V'_{INN}=(V_{INP}-V_{INN})-(V_{REFH}-V_{REFL})$, where $V'_{INP}$ represents a second output signal of said signal filter, $V'_{INN}$ represents said first output signal, $V_{INP}$ represents said first input signal, $V_{INN}$ represents a second input signal of said signal filter, $V_{REFH}$ represents said first reference signal, and $V_{REFL}$ represents a second reference signal.

14. The signal monitoring system as claimed in claim 13, wherein a maximum absolute value of the difference $V'_{INP}-V'_{INN}$ is less than a maximum absolute value of the difference $V_{INP}-V_{INN}$.

15. The signal monitoring system as claimed in claim 13, wherein the difference $V_{REFH}-V_{REFL}$ is equal to half of a maximum level of the difference $V_{INP}-V_{INN}$.

16. The signal monitoring system as claimed in claim 7, wherein said dominant pole increases if said frequency increases, and wherein said dominant pole decreases if said frequency decreases.

17. A method for monitoring a first input signal a plurality of signals, said method comprising:
selecting a first input signal from said plurality of signals;
receiving, at energy storage circuitry in a signal filter, said first input signal and a first reference signal selectively;
generating a first output signal according to said first input signal and said first reference signal;
receiving, at said energy storage circuitry, a feedback signal indicative of said first output signal, wherein said first input signal and said feedback signal are received at said energy storage circuitry in alternating fashion;
controlling a dominant pole of said signal filter by controlling the frequency at which said first input signal and said feedback signal are received at said energy storage circuitry;
controlling said frequency to have a first value when said first input signal is switched from a first signal of said plurality of signals to a second signal of said plurality of signals; and
controlling said frequency to have a second value less than said first value when a time interval expires.

18. The method as claimed in claim 17, further comprising:
receiving said first input signal at a first end of a capacitor in a first time interval;
receiving a second reference signal at a second end of said capacitor in said first time interval;
receiving said first reference signal at said first end of said capacitor in a second time interval; and
providing said first output signal at said second end of said capacitor in said second time interval.

19. The method as claimed in claim 17, further comprising providing a second output signal, wherein a difference between said first and second output signals is indicative of a difference between said first input signal and a second input signal minus a predetermined level that is within a range of said difference between said first and second input signals.

20. The method as claimed in claim 17, further comprising:
increasing said frequency to increase said dominant pole; and
decreasing said frequency to decrease said dominant pole.

\* \* \* \* \*